United States Patent
Lee

(10) Patent No.: US 6,914,829 B2
(45) Date of Patent: Jul. 5, 2005

(54) MULTI-STAGE OUTPUT MULTIPLEXING CIRCUITS AND METHODS FOR DOUBLE DATA RATE SYNCHRONOUS MEMORY DEVICES

(75) Inventor: Sang-bo Lee, Gyeonggi-do (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 10/815,574

(22) Filed: Apr. 1, 2004

(65) Prior Publication Data

US 2004/0196732 A1 Oct. 7, 2004

(30) Foreign Application Priority Data

Apr. 3, 2003 (KR) .................... 10-2003-0021037

(51) Int. Cl.[7] .................... G11C 7/00; G11C 8/00
(52) U.S. Cl. .................... 365/189.02; 365/230.02
(58) Field of Search .................... 365/189.02, 230.02, 365/194, 233

(56) References Cited

U.S. PATENT DOCUMENTS

| | | | | |
|---|---|---|---|---|
| 6,128,244 A | * | 10/2000 | Thompson et al. | ......... 365/233 |
| 6,134,180 A | * | 10/2000 | Kim et al. | .................... 365/233 |
| 6,337,830 B1 | | 1/2002 | Faue | |
| 6,600,691 B2 | * | 7/2003 | Morzano et al. | ............. 365/233 |
| 6,741,521 B2 | * | 5/2004 | Kono | .......................... 365/233 |

* cited by examiner

Primary Examiner—Trong Phan
(74) Attorney, Agent, or Firm—Myers Bigel Sibley & Sajovec

(57) ABSTRACT

An output multiplexing circuit for a Double Data Rate (DDR) synchronous memory device includes n first latches, n first switches, n second switches, n second latches, and two third switches. The n first latches simultaneously prefetch n-bit data transmitted from a memory cell array via a data path. The n first switches simultaneously transfer the n-bit data prefetched into the first latches to n nodes in response to a CAS latency information signal. The n second switches simultaneously transfer data on the nodes in response to n signals that are synchronized with a clock signal and sequentially generated at a predetermined interval. The n second latches store the data transferred via the second switches. The two third switches sequentially transfer the data stored in the n second latches to an input terminal of an output driver of the memory device at a rising edge and a falling edge of a delay signal of the clock signal. Analogous methods also are described.

12 Claims, 5 Drawing Sheets

MULTI-STAGE OUTPUT MULTIPLEXING CIRCUITS AND METHODS FOR DOUBLE DATA RATE SYNCHRONOUS MEMORY DEVICES

RELATED APPLICATION

This application claims the benefit of Korean Patent Application No. 2003-0021037, filed Apr. 3, 2003, the disclosure of which is hereby incorporated herein by reference in its entirety as if set forth fully herein.

FIELD OF THE INVENTION

The present invention relates to semiconductor memory devices, and more particularly to output multiplexing circuits and methods for semiconductor memory devices such as Double Data Rate (DDR) synchronous memory devices.

BACKGROUND OF THE INVENTION

As the operating frequency of a semiconductor memory device increases, an operating speed inside the semiconductor memory device may be reduced and only an operating frequency of an output portion thereof may be increased, using 2-bit, 4-bit, 8-bit or higher prefetch techniques. Thus, an output multiplexing circuit, which serially transfers internal parallel data to an output terminal, may be installed between the semiconductor memory device and the output portion thereof.

For example, in the case of using a 2-bit prefetch technique, in a Double Data Rate (DDR) synchronous memory device that operates at a speed of, for example, 200 Mbps, an internal core circuit may operate at a frequency of, for example, 100 MHz, whereas double data is transferred in parallel to the multiplexing circuit. The multiplexing circuit serially transfers the double data to an output terminal at rising and falling edges of a clock signal. That is, when using a 2-bit prefetch technique, a 2-to-1 multiplexing circuit may be used.

As an operating frequency of a synchronous memory device increases, in general, a 4-bit, an 8-bit or higher prefetch technique may be applied to the synchronous memory device, so as to reduce an operating frequency inside the synchronous memory device. In this case, a 4-to-1, an 8-to-1 or higher multiplexing circuit may be used. An output multiplexing technique for a double data rate (DDR) synchronous memory device is disclosed in U.S. Pat. No. 6,337,830 B1.

FIG. 1 illustrates a conventional output multiplexing circuit, and FIG. 2 is an operational timing diagram to illustrate operation of the circuit shown in FIG. 1. In this case, a 4-bit prefetch technique is assumed.

Referring to FIG. 1, the conventional output multiplexing circuit includes a plurality of first switch groups 101, 102, 103, and 104, each of which comprises four first switches S101, S102, S103, and S104, a plurality of latch groups 111, 112, 113, and 114, each of which comprises four latches L101, L102, L103, and L104, and a plurality of second switch groups 121, 122, 123, and 124, each of which comprises four second switches S111, S112, S113, and S114.

The first switches S101, S102, S103, and S104 transfer 4-bit data DO_F0, DO_S0, DO_F1, and DO_S1, which are transmitted from a memory cell array via a data path, to the latches L101, L102, L103, and L104 in response to corresponding control signals DLi (i is between 0 and n inclusive). Thus, the 4-bit data DO_F0, DO_S0, DO_F1, and DO_S1 is transferred via the first switches S101, S102, S103, and S104, is simultaneously prefetched into the latches L101, L102, L103, and L104.

The control signals DLi are sequentially activated when the memory device performs a burst operation or data read commands are input into the memory device without a gap. As such, a plurality of data that are consecutively transferred via data paths, are stored in different latch groups.

The second switches S111, S112, S113, and S114 sequentially transfer data stored in the latches L101, L102, L103, and L104 to a node NODE1 in response to signals CDQi_F0, CDQi_S0, CDQi_F1, and CDQi_S1 (i=0, 1, 2, 3, ...) that are sequentially activated. CDQi_F0, CDQi_S0, CDQi_F1, and CDQi_S1 are signals that receive Column Address Strobe (CAS) latency information and are sequentially activated.

FIG. 2 is an operational timing diagram illustrating operations of the conventional circuit of FIG. 1. More particularly, FIG. 2 illustrates a clock signal CLK, control signals DL0 and DL1, and sequentially activated CAS latency information signals CDQ0_F0, CDQ0_S0, CDQ0_F1, CDQ0_S1, CDQ1_F0, CDQ1_S0, CDQ1_F1, CDQ1_S1. FIG. 2 also shows output signal DOUT, which is output at output terminal DQ.

In a conventional output multiplexing circuit as described above, as the CAS latency information increases, a parasitic capacitance of the node NODE 1 may increase. As such, it may be difficult to perform high-frequency operations. Moreover, when an operating frequency increases, CAS latency generally increases. In the case of a memory device having CAS latency of 10, i may be 5, and the number of CDQi lines may be 20. All of the CDQi lines may be input into respective output terminals DQ of an output driver 131. The output driver 131 may be controlled in response to an output enable signal PTRST and an inverted output enable signal PTRSTB. Thus, in the case of a wide output terminal DQ (e.g., x16 or x32), the area of a chip may increase due to CDQi line routing.

In addition, skew of a CDQi signal at each output terminal DQ may cause DQ skew, i.e., skew between data output to the output terminal DQ. Thus, each CDQi line may be routed using a skew removal method, such as an H-tree method. As a result, the area of the chip may further increase, and in the case of the wide output terminal DQ, it may be difficult to completely reduce the DQ skew.

SUMMARY OF THE INVENTION

According to some embodiments of the present invention, there are provided output multiplexing circuits for a Double Data Rate (DDR) synchronous memory device. The circuits comprise n (where n is an integer) first latches, which simultaneously prefetch n-bit data transmitted from a memory cell array via a data path. N first switches simultaneously transfer the n-bit data prefetched into the first latches to n nodes in response to a CAS latency information signal. N second switches simultaneously transfer data on the nodes in response to n signals that are synchronized with a clock signal and sequentially generated at a predetermined interval. N second latches store the data transferred via the second switches. Two third switches sequentially transfer the data stored in the n second latches to an input terminal of an output driver of the memory device at a rising edge and a falling edge of a delay signal of the clock signal.

According to other embodiments of the present invention, there are provided output multiplexing circuits for a DDR synchronous memory device. The circuits comprise n (where n is an integer) first latches, which simultaneously prefetch n-bit data transmitted from a memory cell array via a data path. N first switches simultaneously transfer the n-bit data prefetched into the first latches to n nodes in response to a CAS latency information signal. N first logic gates invert the data on the nodes while an output enable signal is enabled. N second switches simultaneously transfer data on the nodes in response to n signals that are synchronized with a clock signal and sequentially generated at a predetermined interval. N second latches store the data transferred via the second switches. Two third switches sequentially transfer the data stored in the n second latches to a pull-up transistor of an output driver of the memory device at a rising edge and a falling edge of a delay signal of the clock signal. N second logic gates output the data on the nodes without inverting it, while the output enable signal is enabled. N fourth switches sequentially transfer output signals of the second logic gates in response to the n signals. N third latches store the data transferred via the fourth switches. Two fifth switches sequentially transfer the data stored in the n third latches to a pull-down transistor of the output driver of the memory device at the rising edge and the falling edge of the delay signal of the clock signal.

According to other embodiments of the present invention, output multiplexing methods for DDR synchronous memory devices comprise simultaneously prefetching n-bit data transmitted from a memory cell array via a data path, simultaneously transferring the prefetched n-bit data to n nodes in response to a CAS latency information signal and transferring data on the nodes in response to n signals that are synchronized with a clock signal and sequentially generated at a predetermined interval. The transferred data is stored, and the stored data is sequentially transferred to an input terminal of an output driver of the memory device at a rising edge and a falling edge of a delay signal of the clock signal.

According to other embodiments of the present invention, output multiplexing methods for DDR synchronous memory devices comprise simultaneously prefetching n-bit data transmitted from a memory cell array via a data path and simultaneously transferring the prefetched n-bit data in response to a CAS latency information signal. The data on the nodes is inverted while an output enable signal is enabled. The inverted data is transferred in response to n signals that are synchronized with a clock signal and sequentially generated at a predetermined interval. The transferred and inverted data is stored and the stored and inverted data is sequentially transferred to a pull-up transistor of an output driver of the memory device at a rising edge and a falling edge of a delay signal of the clock signal. The data on the nodes is output without inverting it while the output enable signal is activated. The non-inverted and transferred data is sequentially transferred in response to the n signals. The sequentially transferred data is stored and the stored data is sequentially transferred to a pull-down transistor of the output driver of the memory device at the rising edge and the falling edge of the delay signal of the clock signal.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like numbers refer to like elements throughout.

It will be understood that although the terms first, second, etc. are used herein to describe various elements, these elements should not be limited by these terms. These terms are only used to distinguish one element from another element. Thus, a first element discussed below could be termed a second element, and similarly, a second element may be termed a first element without departing from the teachings of the present invention. Finally, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 3:
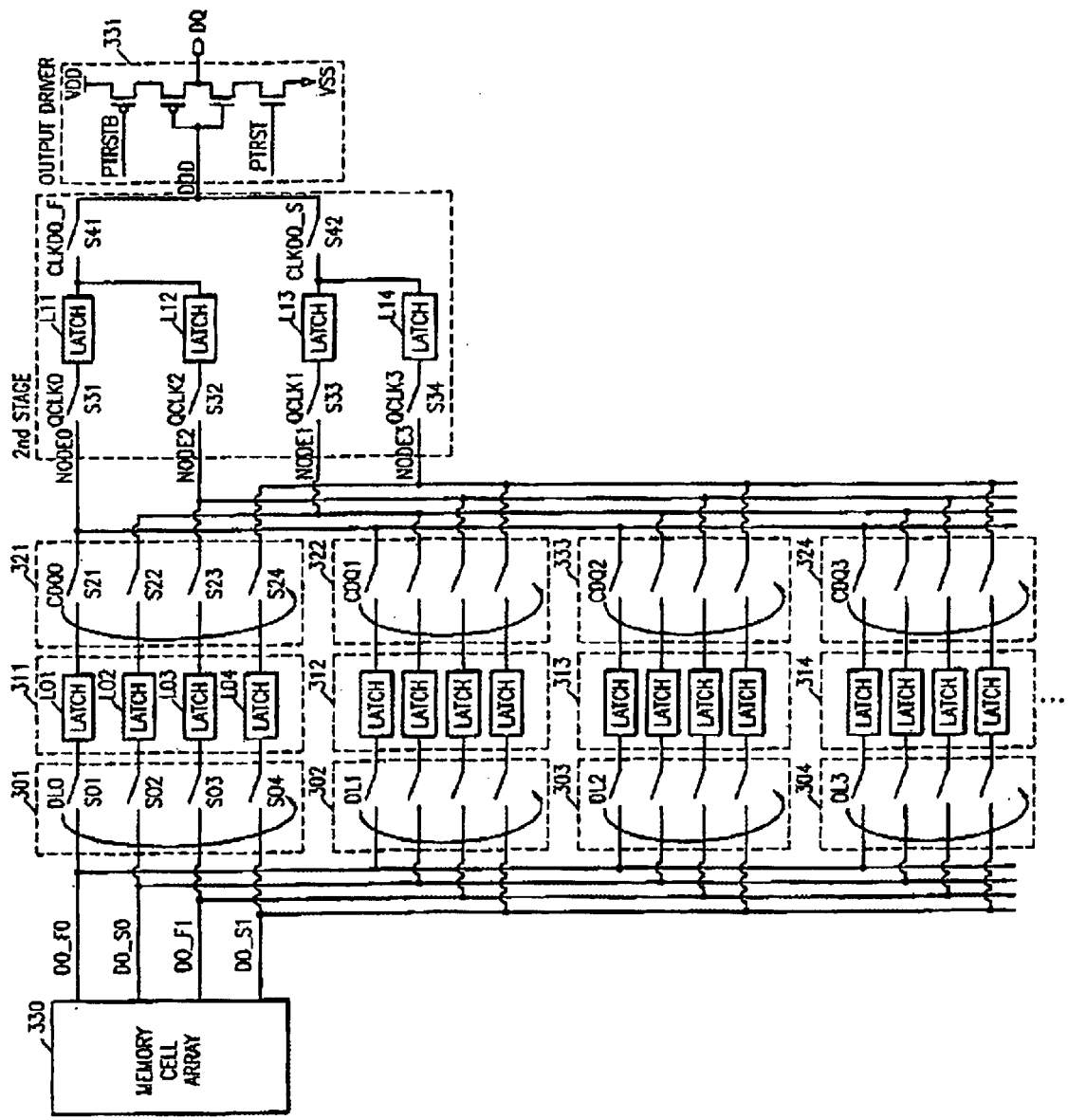
FIG. 3 illustrates an output multiplexing circuit according to some embodiments of the present invention.
Figure 5:
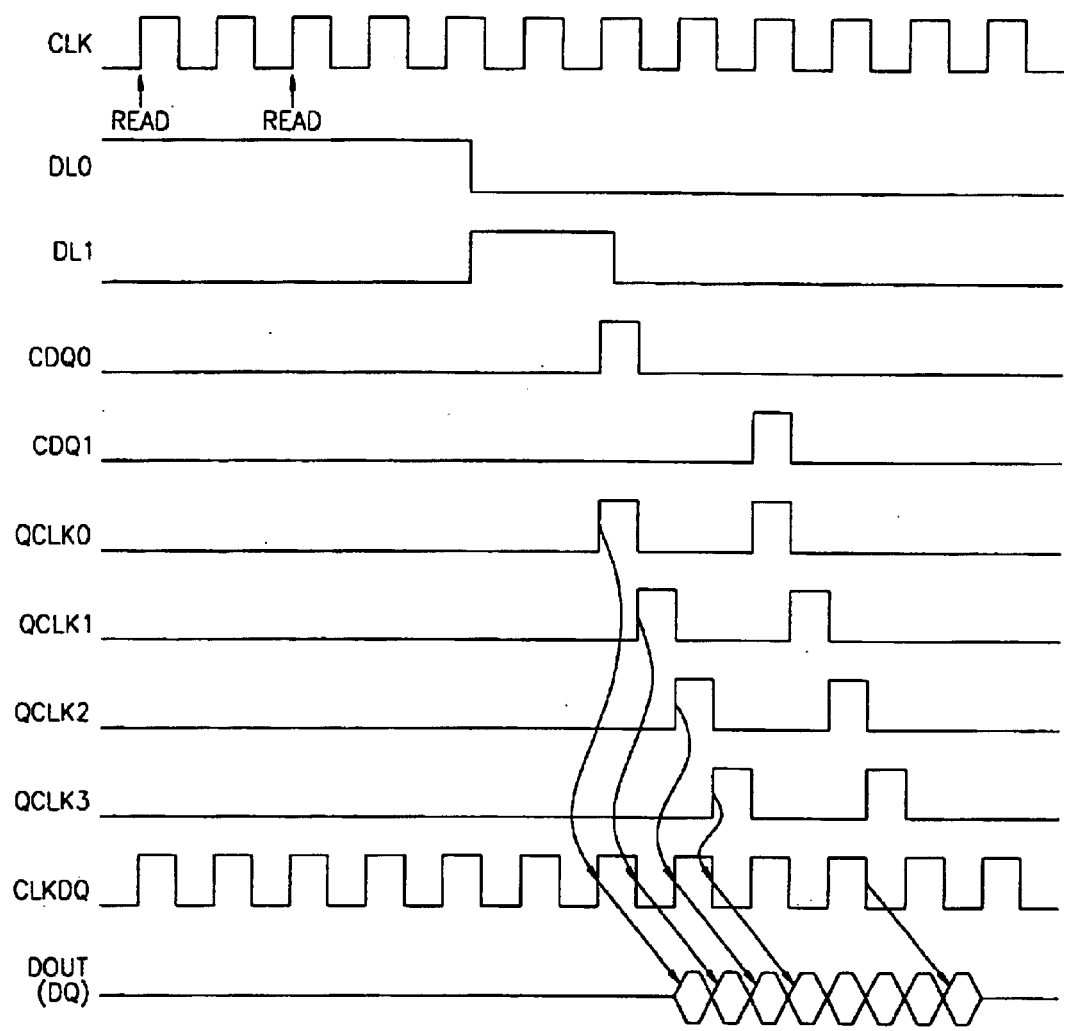
FIG. 5 is an operational timing diagram to illustrate the operation of a circuit shown in FIG. 3.

FIG. 3 illustrates an output multiplexing circuit according to some embodiments of the present invention, and FIG. 5 is an operational timing diagram to illustrate operation of a circuit shown in FIG. 3.

Referring to FIG. 3, an output multiplexing circuit according to some embodiments of the present invention includes a plurality of first switch groups 301, 302, 303, and 304, each of which comprises four first switches S01, S02, S03, and S04, a plurality of latch groups 311, 312, 313, and 314, each of which comprises four first latches L01, L02, L03, and L04, a plurality of second switch groups 321, 322, 323, and 324, each of which comprises four second switches S21, S22, S23, and S24, four third switches S31, S32, S33, and S34, four second latches L11, L12, L13, L14, and two fourth switches S41 and S42. The four third switches S31, S32, S33, and S34, four second latches L11, L12, L13, L14, and two fourth switches S41 and S42 are included in a second stage of the output multiplexing circuit. The output multiplexing circuit further includes an output driver 331 that is controlled in response to output enable signal PTRST and inverted output enable signal PTRSTB to output data on output terminal DQ. The first switches S01, S02, S03, and S04 transfer 4-bit data DO_F0, DO_S0, DO_F1, and DO_S1, which are transmitted from a memory cell array 330 via a data path, to the first latches L01, L02, L03, and L04 in response to corresponding control signals DLi (i is an integer between 0 and n inclusive). Thus, the 4-bit data DO_F0, DO_S0, DO_F1, and DO_S1 is transferred via the first switches S01, S02, S03, and S04, is simultaneously prefetched into the first latches L01, L02, L03, and L04.

In some embodiments, the control signals DLi are sequentially activated when the memory device performs a burst operation or data read commands are input into the memory device without a gap. As such, a plurality of data that are consecutively transferred via data paths, are stored in different latch groups.

The second switches S21, S22, S23, and S24 simultaneously transfer the 4-bit data that are prefetched into the first latches L01, L02, L03, and L04, to four nodes NODE0, NODE1, NODE2, and NODE3 in response to corresponding CAS latency information signals CDQi (i is an integer between 0 and n inclusive). The third switches S31, S32, S33, and S34 sequentially transfer data on the nodes NODE0, NODE1, NODE2, and NODE3 to the second latches L11, L12, L13, and L14 in response to four signals QCLK0, QCLK1, QCLK2, and QCLK3 that are synchronized with a clock signal CLK and sequentially generated at a predetermined interval. The second latches L11, L12, L13, and L14 store data transferred via the third switches S31, S32, S33, and S34. In some embodiments, the predetermined interval corresponds to a half cycle of the clock signal CLK.

The fourth switches S41 and S42 sequentially transfer the data stored in the second latches L11, L12, L13, and L14 at a rising edge F and a falling edge S of a delay signal CLKDQ of the clock signal CLK to an input terminal DOD of an output driver 331 of a memory device. More specifically, in some embodiments, at a first rising edge F of the delay signal CLKDQ (illustrated as CLKDQ_F), the data stored in the latch L11 is transferred to the input terminal DOD of the output driver 331 via the switch S41, and at a first falling edge S of the delay signal CLKDQ (illustrated as CLKDQ_S), the data stored in the latch L13 is transferred to the input terminal DOD of the output driver 331 via the switch S42.

Hereinafter, the operation of an output multiplexing circuit shown in FIG. 3, according to some embodiments of the present invention will be described in greater detail, with reference to the operational timing diagram of FIG. 5. First, similar to FIG. 1, when DL0 is activated, 4-bit data transmitted via first switches S01, S02, S03, and S04 is simultaneously prefetched into first latches L01, L02, L03, and L04. Next, in contrast to FIG. 1, when CDQ0 is activated, the 4-bit data prefetched into the first latches L01, L02, L03, and L04 is simultaneously transferred to four nodes NODE0, NODE1, NODE2, and NODE3 via second switches S21, S22, S23, and S24. Data is similarly prefetched and transferred responsive to the activation of DL1 and CDQ1, respectively. In the case of using a 4-bit prefetch technique, data is output for two cycles of a clock signal CLK. Thus, for example, after CDQ0 is enabled, CDQ1 is enabled after two cycles of the clock signal CLK, as shown in FIG. 5.

Next, data on the nodes NODE0, NODE1, NODE2, and NODE3 is transferred to the second latches L11, L12, L13, and L14 and stored therein via the third switches S31, S32, S33, and S34 in response to four signals QCLK0, QCLK1, QCLK2, and QCLK3 that are sequentially enabled, for example, at an interval of a half cycle of the clock signal CLK.

Finally, the data stored in the second latches L11, L12, L13, and L14 is transferred to an input terminal DOD of the output driver 331 at a rising edge F and a falling edge S of a delay signal CLKDQ of the clock signal CLK via fourth switches S41 and S42 for two cycles of the clock signal CLK, for output as output signal DOUT via output terminal DQ.

In the aforementioned output multiplexing circuit according to some embodiments of the present invention, in the case of a memory device having CAS latency (CL) of 10, the number of control lines may be reduced from 20 to 10, that is, CDQ0, CDQ1, CDQ2, CDQ3, and CDQ4, QCLK0, QCLK1, QCLK2, and QCLK3, and CLKDQ. Thus, the area of a chip may be reduced compared to the area of a conventional chip. In addition, the two fourth switches S41 and S42 may be controlled by one line CLKDQ. This can reduce skew between data output-to-output terminals DQs.

Figure 1:
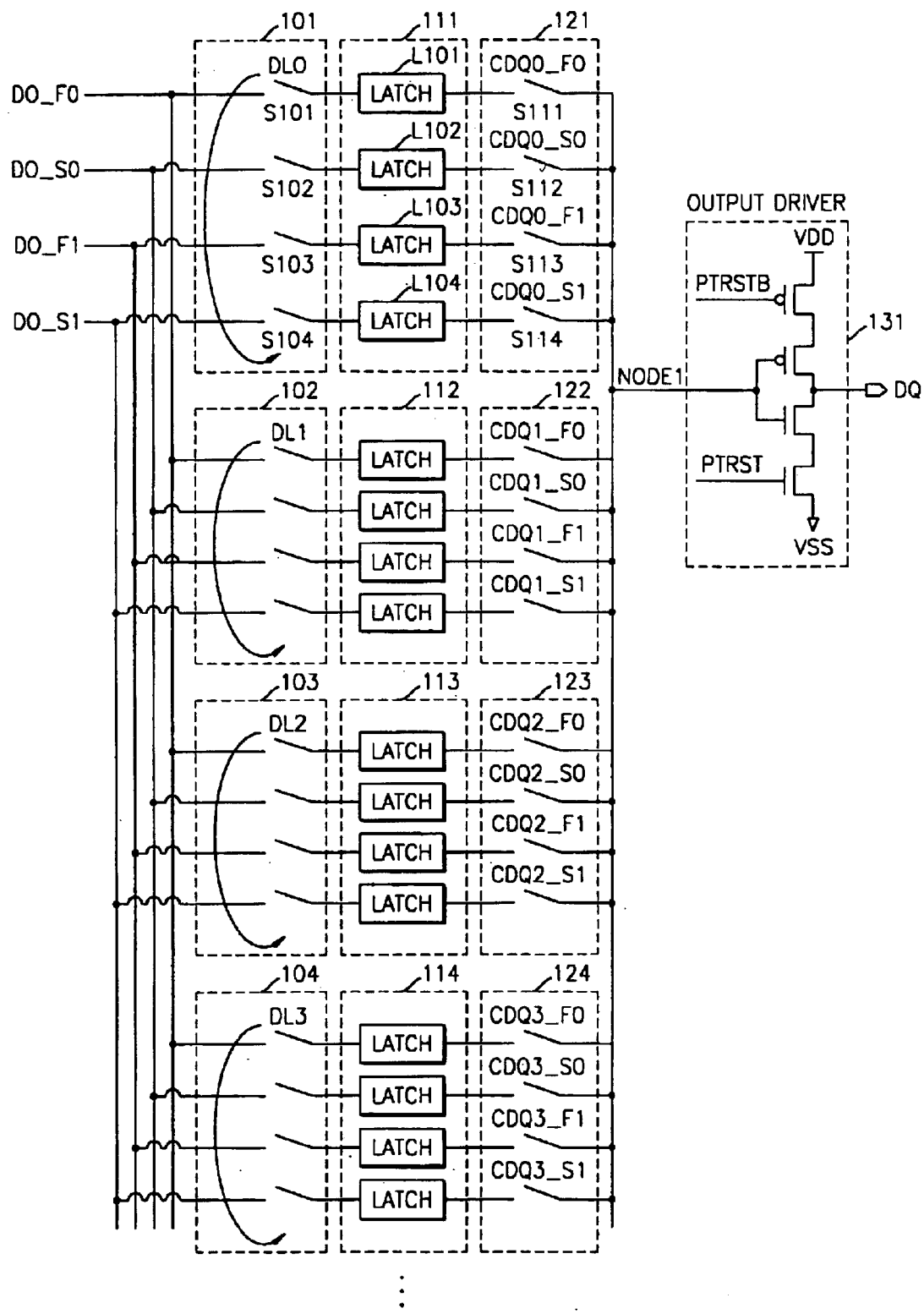
FIG. 1 illustrates a conventional output multiplexing circuit.
Figure 2:
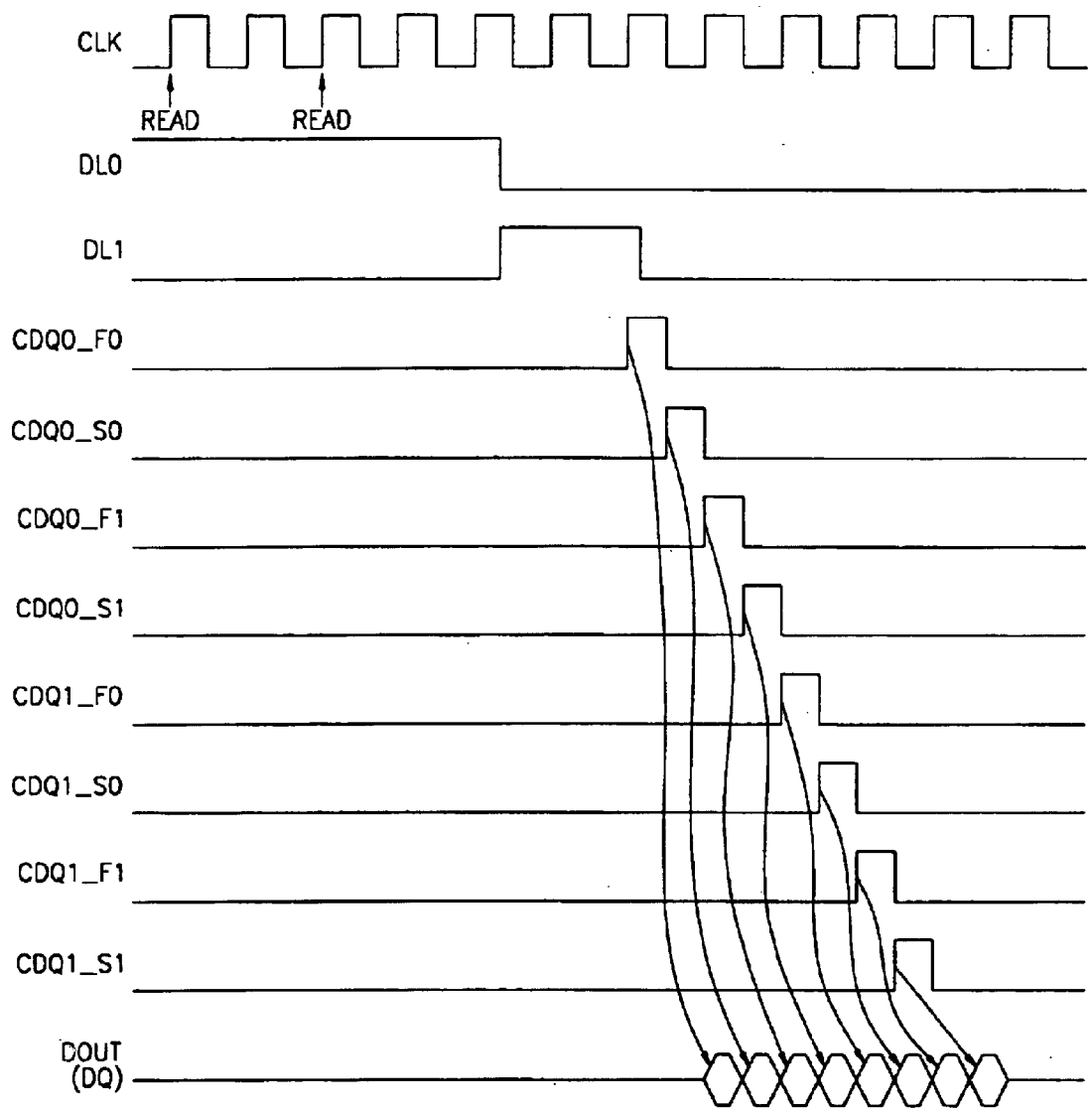
FIG. 2 is an operational timing diagram to illustrate operation of the circuit shown in FIG. 1.

In addition, the conventional node NODE1 of FIG. 1 is divided into the nodes NODE0, NODE1, NODE2, and NODE3 in FIG. 3. Thus, a parasitic capacitance of each node may be reduced, and a high-frequency operation can be performed.

Accordingly, these embodiments of the present invention can provide output multiplexing circuits for a memory device. These output multiplexing circuits comprise n first latches, which simultaneously prefetch n-bit data transmitted from a memory cell array. N first switches simultaneously transfer the n-bit data that was prefetched into the n first latches to n nodes. N second switches transfer data on the n nodes in response to n signals. N second latches store the data transferred via the second switches. Two third switches sequentially transfer the data stored in the n second latches to an output driver of the memory device at a rising edge and a falling edge of a signal. Analogous methods also may be provided.

Figure 4:
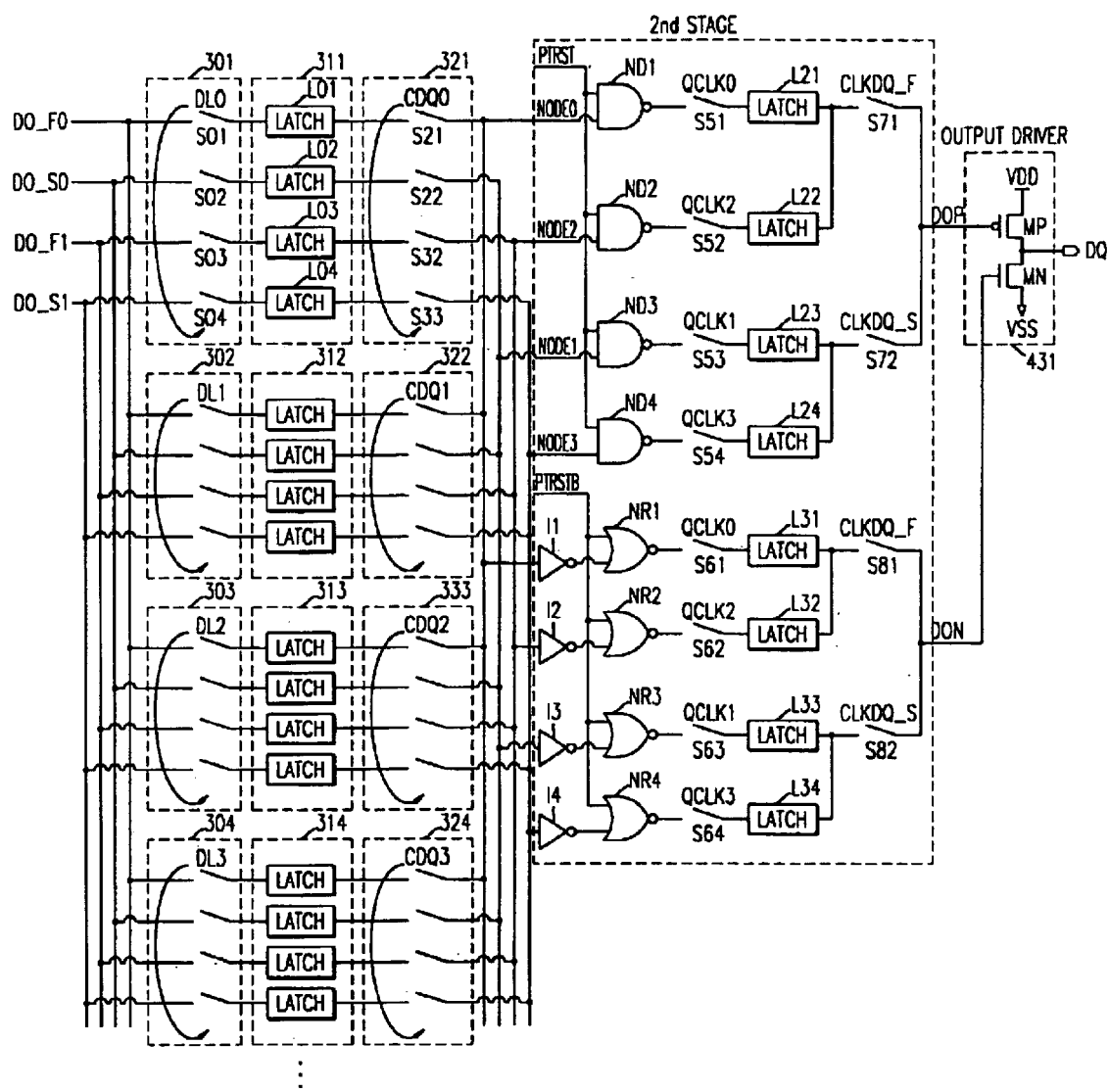
FIG. 4 illustrates an output multiplexing circuit according to other embodiments of the present invention.

FIG. 4 illustrates an output multiplexing circuit according to other embodiments of the present invention. Here, a 4-bit prefetch technique is assumed.

Referring to FIG. 4, a second stage of an output multiplexing circuit according to these other embodiments of the present invention includes four NAND gates ND1, ND2, ND3, and ND4 that are controlled in response to an output enable signal PTRST, four NOR gates NR1, NR2, NR3, and NR4 that are controlled in response to an inverted signal PTRSTB of the output enable signal PTRST, four switches S51, S52, S53, and S54 that are controlled in response to signals QCLK0, QCLK1, QCLK2, and QCLK3, four latches L21, L22, L23, and L24, four latches L31, L32, L33, and L34, two switches S71 and S72, and two switches S81 and S82.

The NAND gates ND1, ND2, ND3, and ND4 invert data on the nodes NODE0, NODE1, NODE2, NODE3, and NODE4 while the output enable signal PTRST is activated or enabled. Inverters I1, I2, I3, and I4 and NOR gates NR1, NR2, NR3, and NR4 output data on the nodes NODE0, NODE1, NODE2, NODE3, and NODE4 without inverting it while the output enable signal PTRST is activated or enabled, that is, while the inverted signal PTRSTB of the output enable signal PTRST is deactivated.

The switches S51, S52, S53, and S54 sequentially transfer output signals of the NAND gates ND1, ND2, ND3, and ND4 to the latches L21, L22, L23, and L24. The latches L21, L22, L23, and L24 store the data transferred via the switches S51, S52, S53, and S54. The switches S71 and S72 sequentially transfer the data stored in the latches L21, L22, L23, and L24 to a gate of a pull-up transistor MP of the output driver 431 at a rising edge F and a falling edge S of a delay signal CLKDQ of the clock signal CLK.

The switches S61, S62, S63, and S64 sequentially transfer output signals of the NOR gates NR1, NR2, NR3, and NR4 to the latches L31, L32, L33, and L34 in response to the four signals QCLK0, QCLK1, QCLK2, and QCLK3. The latches L31, L32, L33, and L34 store the data transferred via the switches S61, S62, S63, and S64. The switches S81 and S82 transfer the data stored in the latches L31, L32, L33, and L34 to a gate of a pull-down transistor MN of the output driver 431 at the rising edge F and the falling edge S of the delay signal CLKDQ of the clock signal CLK.

Operation of output multiplexing circuits according to these other embodiments of the present invention may be similar to the output multiplexing circuit according to the earlier described embodiments of the present invention. However, in embodiments of FIG. 4, the pull-up and pull-down of the output driver 431 are controlled in response to signals DOP and DON. A signal DOP that drives pull-up of the output driver 431 may be different from a signal DON that drives pull-down of the output driver 431. Thus, a rising time and a falling time of data may be controlled independently. In addition, the node DOD of FIG. 3 is divided into two nodes DOP and DON in FIG. 4. Thus, operation at a higher frequency may be performed.

Accordingly, embodiments of FIG. 4 can add n first logic gate which invert data on the n nodes, while an output enable signal is enabled, and the two third switches transfer the data stored in the n second latches to a pull-up transistor of the output driver of the memory device at a rising edge and a falling edge of the signal. N second logic gates also are provided which output the data on the n nodes without inverting the data, while the output signal is enabled. N fourth switches transfer output signals of the n second logic gates in response to the n signals. N third latches store the data transferred via the n fourth switches. Two fifth switches sequentially transfer the data stored in the n third latches to a pull-down transistor of the output driver of the memory device at the rising edge and falling edge of the signal. Analogous methods also may be provided.

It will be understood that, for explanatory convenience, a 4-bit prefetch technique has been explained herein. However, the present invention may be applied to a case of an 8-bit or higher prefetch technique.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An output multiplexing circuit for a Double Data Rate (DDR) synchronous memory device, the output multiplexing circuit comprising:
   n (where n is an integer) first latches, which simultaneously prefetch n-bit data transmitted from a memory cell array via a data path;
   n first switches, which simultaneously transfer the n-bit data prefetched into the first latches to n nodes in response to a CAS latency information signal;
   n second switches, which simultaneously transfer data on the nodes in response to n signals that are synchronized with a clock signal and sequentially generated at a predetermined interval;
   n second latches, which store the data transferred via the second switches; and
   two third switches, which sequentially transfer the data stored in the n second latches to an input terminal of an output driver of the memory device at a rising edge and a falling edge of a delay signal of the clock signal.

2. The circuit of claim 1, wherein the predetermined interval is a half cycle of the clock signal.

3. An output multiplexing circuit for a Double Data Rate (DDR) synchronous memory device, the output multiplexing circuit comprising:
   n (where n is an integer) first latches, which simultaneously prefetch n-bit data transmitted from a memory cell array via a data path;
   n first switches, which simultaneously transfer the n-bit data prefetched into the first latches to n nodes in response to a CAS latency information signal;
   n first logic gates, which invert the data on the nodes while an output enable signal is enabled;
   n second switches, which simultaneously transfer data on the nodes in response to n signals that are synchronized with a clock signal and sequentially generated at a predetermined interval;
   n second latches, which store the data transferred via the second switches;
   two third switches, which sequentially transfer the data stored in the n second latches to a pull-up transistor of an output driver of the memory device at a rising edge and a falling edge of a delay signal of the clock signal;
   n second logic gates, which output the data on the nodes without inverting it while the output enable signal is enabled;
   n fourth switches, which sequentially transfer output signals of the second logic gates in response to the n signals;
   n third latches, which store the data transferred via the fourth switches; and
   two fifth switches, which sequentially transfer the data stored in the n third latches to a pull-down transistor of the output driver of the memory device at the rising edge and the falling edge of the delay signal of the clock signal.

4. The circuit of claim 3, wherein the predetermined interval is a half cycle of the clock signal.

5. An output multiplexing method for a Double Data Rate (DDR) synchronous memory device, the output multiplexing method comprising:
   simultaneously prefetching n-bit data transmitted from a memory cell array via a data path;
   simultaneously transferring the prefetched n-bit data to n nodes in response to a CAS latency information signal;
   transferring data on the nodes in response to n signals that are synchronized with a clock signal and sequentially generated at a predetermined interval;
   storing the transferred data; and
   sequentially transferring the stored data to an input terminal of an output driver of the memory device at a rising edge and a falling edge of a delay signal of the clock signal.

6. The method of claim 5, wherein the predetermined interval is a half cycle of the clock signal.

7. An output multiplexing method for a Double Data Rate (DDR) synchronous memory device, the output multiplexing method comprising:
   simultaneously prefetching n-bit data transmitted from a memory cell array via a data path;
   simultaneously transferring the prefetched n-bit data in response to a CAS latency information signal;
   inverting the data on the nodes while an output enable signal is enabled;
   transferring the inverted data in response to n signals that are synchronized with a clock signal and sequentially generated at a predetermined interval;
   storing the transferred and inverted data;
   sequentially transferring the stored and inverted data to a pull-up transistor of an output driver of the memory device at a rising edge and a falling edge of a delay signal of the clock signal;
   outputting the data on the nodes without inverting it while the output enable signal is enabled;
   sequentially transferring the non-inverted and transferred data in response to the n signals;

storing the sequentially-transferred data; and sequentially transferring the stored data to a pull-down transistor of the output driver of the memory device at the rising edge and the falling edge of the delay signal of the clock signal.

8. The method of claim 7, wherein the predetermined interval is a half cycle of the clock signal.

9. An output multiplexing circuit for a memory device, the output multiplexing circuit comprising:

n (where n is an integer) first latches, which simultaneously prefetch n-bit data transmitted from a memory cell array;

n first switches, which simultaneously transfer the n-bit data that was prefetched into the n first latches to n nodes;

n second switches, which transfer data on the n nodes in response to n signals;

n second latches, which store the data transferred via the second switches; and two third switches, which sequentially transfer the data stored in the n second latches to an output driver of the memory device at a rising edge and a falling edge of a signal.

10. An output multiplexing circuit according to claim 9 further comprising:

n first logic gates, which invert the data on the n nodes while an output enable signal is enabled;

wherein the two third switches transfer the data stored in the n second latches to a pull-up transistor of the output driver of the memory device at a rising edge and a falling edge of the signal;

n second logic gates, which output the data on the n nodes without inverting the data, while the output enable signal is enabled;

n fourth switches, which transfer output signals of the n second logic gates in response to the n signals;

n third latches, which store the data transferred via the n fourth switches; and two fifth switches, which sequentially transfer the data stored in the n third latches to a pull-down transistor of the output driver of the memory device at the rising edge and the falling edge of the signal.

11. An output multiplexing method for a memory device, the output multiplexing method comprising:

simultaneously prefetching n-bit data transmitted from a memory cell array;

simultaneously transferring the prefetched n-bit data to n nodes;

transferring data on the n nodes in response to n signals;

storing the data that was transferred; and sequentially transferring the stored data to an output driver of the memory device at a rising edge and a falling edge of a signal.

12. An output multiplexing method according to claim 11, further comprising:

inverting the data on the n nodes while an output enable signal is enabled;

wherein transferring data on the n nodes in response to n signals comprises transferring the inverted data on the n nodes in response to the n signals;

storing the transferred and inverted data;

wherein sequentially transferring the stored data to an output driver comprises sequentially transferring the stored and inverted data to a pull-up transistor of an output driver of the memory device at a rising edge and a falling edge of a signal;

outputting the data on the n nodes without inverting it while the output enable signal is enabled;

transferring the non-inverted and transferred data in response to the n signals;

storing the transferred non-inverted data; and sequentially transferring the stored data to a pull-down transistor of the output driver of the memory device at the rising edge and the falling edge of the signal.

* * * * *